July 25, 1967 N. SIGNORE 3,332,309

FASTENING DEVICE FOR TUNING PINS

Filed Feb. 7, 1966

INVENTOR.
Nicola Signore
BY [signature]
Agent

3,332,309
FASTENING DEVICE FOR TUNING PINS

Nicola Signore, Via Lorenteggio 178, Milan, Italy

Filed Feb. 7, 1966, Ser. No. 525,751
3 Claims. (Cl. 84—201)

Figure 1:
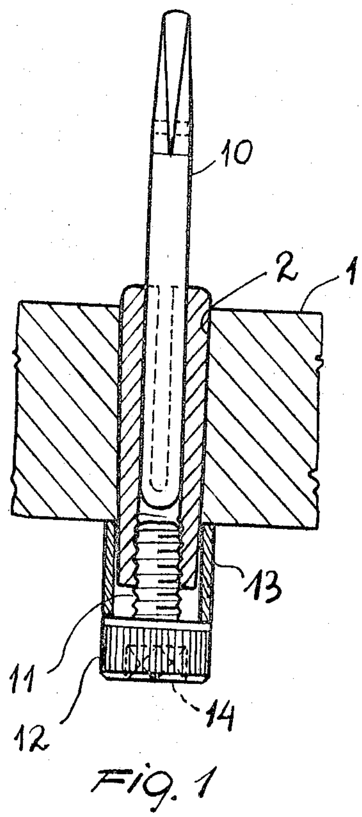

This invention relates to tuning pins for pianos.

Tuning pins are known, which are fixed in the respective hole of the wrest-plank by providing this hole with a taper and by interposing between the tuning pin and the walls of the hole a tapered sleeve member, adapted to the diameter and the taper of the hole, and provided with a longitudinal slit allowing the variation of the diameter of the said sleeve member. The tuning pin is clamped within the sleeve member by driving the conical sleeve member, with the tuning pin therein, into the hole, so that the diameter of the sleeve member restricts due to the wedging action of the tapered hole. The tuning pin as well as the sleeve member are maintained in their fixed position by the friction action between the contacting parts. However, a satisfactory degree of clamping action was not easy to attain due to the critical nature thereof and the friction action alone was not always considered as sufficiently safe and resistant. The need was felt for additional fastening and adjusting means, which will adjust and fasten in an exact and positive manner the tuning pin. In an attempt to solve this problem, the tuning pin was made conical and at the end thereof a screw thread has been provided, which was adapted to cooperate with a nut bearing against the wrest-plank and suitable to urge, when tightened, the tuning pin in the converging direction thereof, thereby fixing the tuning pin positively in the axial direction by means of the nut and preventing rotation of the pin due to the friction action between the walls of the hole or of a sleeve member in which the tuning pin is placed and through which the wedging or clamping action is exerted.

Such tuning pins had a series of drawbacks. It was not possible to use the existing cylindrical tuning pins and special conical tuning pins had to be made for pianos. Furthermore a screw thread had to be machined on the end of the pin. For these reasons the cost of such a tuning pin highly increased. There were also functional drawbacks of such known tuning pins. In fact, the tuning operation, involving rotation of the tuning pin, was not suitable to be carried out, since the tuning pin was directly locked by the nut provided at the screwed end thereof. The danger existed also that during the rotation of the pin for tuning purposes the fastening nut became unscrewed, so that special means had to be provided for avoiding such unscrewing possibilities during the tuning operation. These increased further the costs and complicated both the assembling as well as the tuning operations.

Furthermore, it was not possible to easily regulate and adjust the clamping or locking action of the tuning pin. In addition, no adjustment in the axial direction of the pin was possible, since in this direction the pin was positively locked by the screw nut.

It is an object of this invention to avoid these drawbacks of the known tuning pin fastening devices and to allow the tuning pin to be adjusted or regulated both angularly as well as in the axial direction, without influencing by such adjustment or regulation the clamping or locking action exerted on the tuning pin.

These and other objects, which will become clear from the description which follows, are attained by the use of a conventional cylindrical tuning pin with a smooth surface and which will be adapted to cooperate with a sleeve member having a conical outer surface and a cylindrical inner smooth surface of the hole thereof and having further a longitudinal slit along at least a substantial portion of its lengths, the outer conical surface of the sleeve member being adapted to cooperate in a wedging manner with a correspondingly tapered hole provided in the wrest-plank and wherein the end portion of the sleeve member opposite to the head of the pin is provided internally with a screw thread in which a screw is screwed, said screw having a head with a diameter greater than the diameter of the hole of the wrest-plank in which the sleeve member is arranged, a second sleeve member surrounding the screw shaft and at least the threaded portion of said sleeve member being provided, said second sleeve member, having an inner diameter equal or greater than the diameter of the hole of the wrest-plank in which the sleeve member is driven. The first and the second sleeve member being such as to allow a relative motion between them at least at the end portion of the sleeve member.

It will be appreciated that by such an arrangement the tuning pin is clamped only by the externally conical sleeve member, which is internally cylindrical so that the pin may be adjusted in the axial direction or rotated without influencing the clamping action acting thereon, since this clamping action is determined only by the position of the externally conical sleeve member within the conical hole of the wrest-plank, which position is in turn maintained constant by the action of the screw on the externally conical sleeve member. This action of the screw will prevent any rotation of the externally conical sleeve member during the rotation of the tuning pin and will also prevent any axial displacement of the said externally conical sleeve member during the axial adjustment of the pin, while the clamping action will constantly be maintained unchanged and with a best clamping degree. This clamping degree may be established by the manufacturer during the assembling of the piano and subsequently the tuning operation may always be suitably carried out, without actuating the locking screw. The pitch of the thread of the locking screw may be chosen so that a highly exact clamping degree may be obtained. Advantageously, the head of the screw is provided with a quadrangular recess for a special quadrangular key, thus allowing a very dense arrangement of such tuning pins in the wrest-plank without affecting the possibility of screwing the screw with the special key.

Figure 2:
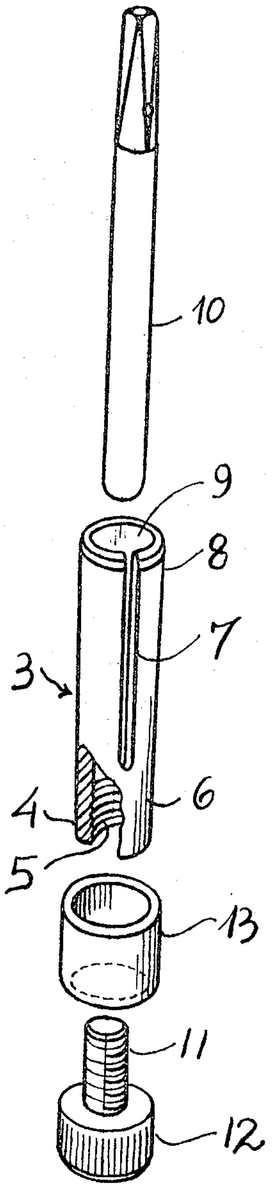

The invention will now be more fully described with reference to the accompanying drawing in which:

FIG. 1 shows an axial section through the fastening assembly of the tuning pin and FIG. 2 shows an exploded perspective view, partially in section, of the main component parts of the said fastening assembly.

With reference to the drawing, there is shown the wrest-plank 1 of metal in which a plurality of conical through holes 2 are provided, of which only one is shown in the drawing, these holes being adapted to receive a metallic sleeve member 3, which has its external surface of conical shape, suitably corresponding to the conical shape of the through-hole 2. The through-hole has an upper greater diameter base and a lower smaller diameter base. The sleeve member 3 has at its lower smaller diameter end 4, i.e. the end corresponding to the base of smaller external diameter of the frusto-conical shape of the sleeve member, an inner screw thread 5 extending over a portion 6 of the sleeve member. The same sleeve member has a longitudinal split 7 extending from the upper greater diameter end 8 of the sleeve member, i.e. the end corresponding to the base of greater diameter of the frusto-conical external surface of the sleeve member 3, up to the end portion 6 of the sleeve member, i.e. up to the internally screw-threaded portion thereof. The internal surface of the hole of the sleeve member 3 is cylindrical and smooth. In the sleeve member, there is received, in the assembled position, the tuning pin 10 of conventional type, i.e. with a cylindrical shaft having a smooth surface. On the lower end of the sleeve member 3 there is screwed, engaging with the screw thread 5 of the sleeve member 3, a screw 11 having a screw thread corresponding to the screw thread 5 of the sleeve member and having a disc like head 12, having a diameter which is greater than at least the diameter of the through-hole 2 at the minor basis of the frusto-conical shape of the inner surface of the hole.

Between the head 12 of the screw 11 and the wrest-plank 1 there is provided a bushing 13 having an inner diameter slightly greater than the outer diameter of the portion 6 of the sleeve member 3, so as to allow relative movement of the corresponding surfaces and having an outer diameter which is equal or less than the diameter of the head 12 of the screw 11. The length of the bushing 13 is preferably greater than the axial extension of the active portion of the screw thread 5. The bushing member 13 serves as a spacer means for the head 12, with respect to the wrest-plank.

The head 12 has a recess 14 in the outer external portion thereof, the recess having a polygonal shape adapted to receive a wrench key of polygonal shape, for actuating the screw therewith, without occupying with the key a space greater than the diameter of the head 12.

The operation of the fastening assembly is as follows:

In the assembled position as shown in FIG. 1 the screw 11 is tightened by acting with the wrench key engaging the recess 14. By this action the sleeve member 3 is shifted downwardly and due to the convergency of the conical shape of the through-hole 2 and due to the conical shape of the outer surface of the sleeve 3, a wedging action occurs through which the sleeve member is elastically tightened, owing to the longitudinal split 7 and firmly clamps the tuning pin 10. By screwing the screw 11 the bushing 13 prevents the approaching of the screw to the wrest-plank so that through the counterreaction on the screw threads the sleeve member 3 is downwardly shifted up to the desired degree. By the screwing of the screw 11, it is possible exactly to establish the clamping degree acting on the tuning pin 10. This clamping degree should be within a pre-established optimum range. To those skilled in the art it will be obvious that the clamping degree should not exceed a certain value, since otherwise the tuning operation cannot be effected smoothly and the strain on the material may be excessive.

In the same manner a clamping action below a pre-established degree will not sufficiently fix the tuning pin and the action of the string may cause rotation of the tuning pin and the slackening of the string. It should be noted that in the modern techniques of piano manufacturing the tightening of the screw 11 is carried out during the assembly of the component parts of the piano and should be left with such a tightening degree during almost the entire life of the piano, owing to the fact that the tuning operation should not effect the clamping force exerted on the pin. It has been found that the optimum clamping action varies within such a restricted range, that the optimum clamping degree may be considered as a critical point of the screwing degree of the screw 11. This critical point is very difficult to attain and the tightening operation is of highly delicate nature. It is therefore preferred to use an adequate pitch of the screw thread. It will be obvious that without the described screwing means it would never be possible to attain the optimum clamping action for the tuning pin.

It will be also obvious that the adjustment in the axial direction of the tuning pin is possible without effecting the clamping action. Furthermore it will be obvious that due to the longitudinal split extending over almost the entire length of the sleeve member, the clamping action is uniformly distributed over the entire active clamping surfaces.

I claim:

1. A fastening device for a tuning pin, comprising: means defining a conical through-hole in a wrest-plank, said hole having a smaller diameter base at one end thereof and a greater diameter base at the opposite end thereof; a sleeve member having a conical outer surface, a smooth cylindrical axial hole adapted to receive a cylindrical tuning pin, a smaller diameter end and a greater diameter end, an inner screw-threaded portion in said axial hole near said smaller diameter end, a longitudinal split in said sleeve member and extending from said greater diameter end up to said inner screw-threaded portion, said sleeve member being adapted to be received in said conical through-hole and to engage with the said means defining said through-hole, a screw screwed with one portion thereof into the screw-threaded portion of said axial-hole, said screw having a head with a diameter greater than the diameter of said through-hole at said smaller diameter base, said head being spaced from said wrest-plank, and spacer means for maintaining said head spaced from said wrest-plank.

2. A device according to claim 1, wherein said inner screw-threaded portion projects outwardly from said smaller diameter base of said through-hole.

3. A device according to claim 1, wherein said spacer means is a bushing member at least partially surrounding the screw threaded portion of said screw and a portion of said sleeve member near said smaller diameter end, said bushing member having an outer diameter greater than the diameter of said smaller diameter base and an inner diameter smaller than the diameter of said head and greater than the diameter of said smaller diameter end of the sleeve member.

References Cited

UNITED STATES PATENTS

| | | | |
|---|---|---|---|
| 375,150 | 12/1887 | Goodenow | 84—202 |
| 1,626,380 | 4/1927 | Avery et al. | 84—305 |
| 1,721,904 | 7/1929 | Grover | 84—305 |

RICHARD B. WILKINSON, *Primary Examiner.*

CHARLES M. OVERBEY, *Examiner.*